(12) United States Patent
Chou

(10) Patent No.: US 6,304,443 B1
(45) Date of Patent: Oct. 16, 2001

(54) POWER SUPPLY EQUIPPED WITH EXTRACTABLE FAN DECK

(75) Inventor: Chin-Wen Chou, Taipei (TW)

(73) Assignee: Shin Jiuh Corp., Taipei Hsien (TW)

( * ) Notice: Subject to any disclaimer, the term of this patent is extended or adjusted under 35 U.S.C. 154(b) by 0 days.

(21) Appl. No.: 09/627,407

(22) Filed: Jul. 27, 2000

(51) Int. Cl.[7] ............................................... H05K 7/20
(52) U.S. Cl. ........................... 361/695; 361/736; 454/184
(58) Field of Search ............................. 307/150; 361/683, 361/686–688, 694–695, 727, 730, 736, 752

(56) References Cited

U.S. PATENT DOCUMENTS

| | | | |
|---|---|---|---|
| 5,208,730 | * | 5/1993 | Tracy .................................... 361/695 |
| 6,074,296 | * | 6/2000 | Wu ........................................ 454/184 |
| 6,208,520 | * | 3/2001 | Schmitt ................................. 307/150 |
| 6,246,580 | * | 6/2001 | Weng .................................... 361/695 |

\* cited by examiner

*Primary Examiner*—Gregory Thompson
(74) *Attorney, Agent, or Firm*—Bacon & Thomas, PLLC

(57) ABSTRACT

A power supply equipped with extractable fan deck to be applied in a computer system comprises a casing and an extractable fan set. The casing further comprises: a main frame formed by a double bending; a lateral board jointed to a lateral face of the main frame; and a rear board mounted to one end of the main frame. The extractable fan set further comprises: a sub-frame with a bent edge for jointing and defining an installation space with the rear board and a fan deck disposed in the installation space. A first fan housed in the fan deck is operated with an associated second fan located oppositely at the front end of a set of power-supply units for creating air convection to improve heat dissipation efficiency and keep the power supply under normal conditions.

8 Claims, 3 Drawing Sheets

POWER SUPPLY EQUIPPED WITH EXTRACTABLE FAN DECK

BACKGROUND OF THE INVENTION

This invention relates generally to power supplies, more particularly, it relates to a power supply equipped with extractable fan deck, wherein an extractable fan deck mounted with a cooling fan is inserted in a close end of a set of power-supply units for creating air convection for cooling down inside components and for improving heat-dissipation efficiency so as to keep the power supply under normal conditions.

Subsequent to requirement of high processing speed in computer, a high efficiency power supply becomes a pressing need in recent days.

In computer operation, particularly in high speed processing, heat dissipation is always an important problem pending improvement that all the computer makers cannot afford to neglect.

As a single miniature fan is found obviously incapable of offering sufficient airflow for cooling components inside a computer, the inventor of this invention is to propose an improved mechanism pertaining to the subject matter in the hope of providing something helpful.

SUMMARY OF THE INVENTION

The primary object of this invention is to provide a power supply equipped with extractable fan deck, wherein an extractable fan deck mounted with a cooling fan is inserted in a close end of a set of power-supply units for creating air convection to cool down components inside and for improving heat-dissipation efficiency so as to eliminate above said defects and keep the power supply under normal conditions.

For more detailed information regarding this invention together with further advantages or features thereof, at least an example of preferred embodiment will be elucidated below with reference to the annexed drawings.

BRIEF DESCRIPTION OF THE DRAWINGS

The related drawings in connection with the detailed description of this invention, which is to be made later, are described briefly as follows, in which.

DETAILED DESCRIPTION OF THE PREFERRED EMBODIMENT

Figure 1:
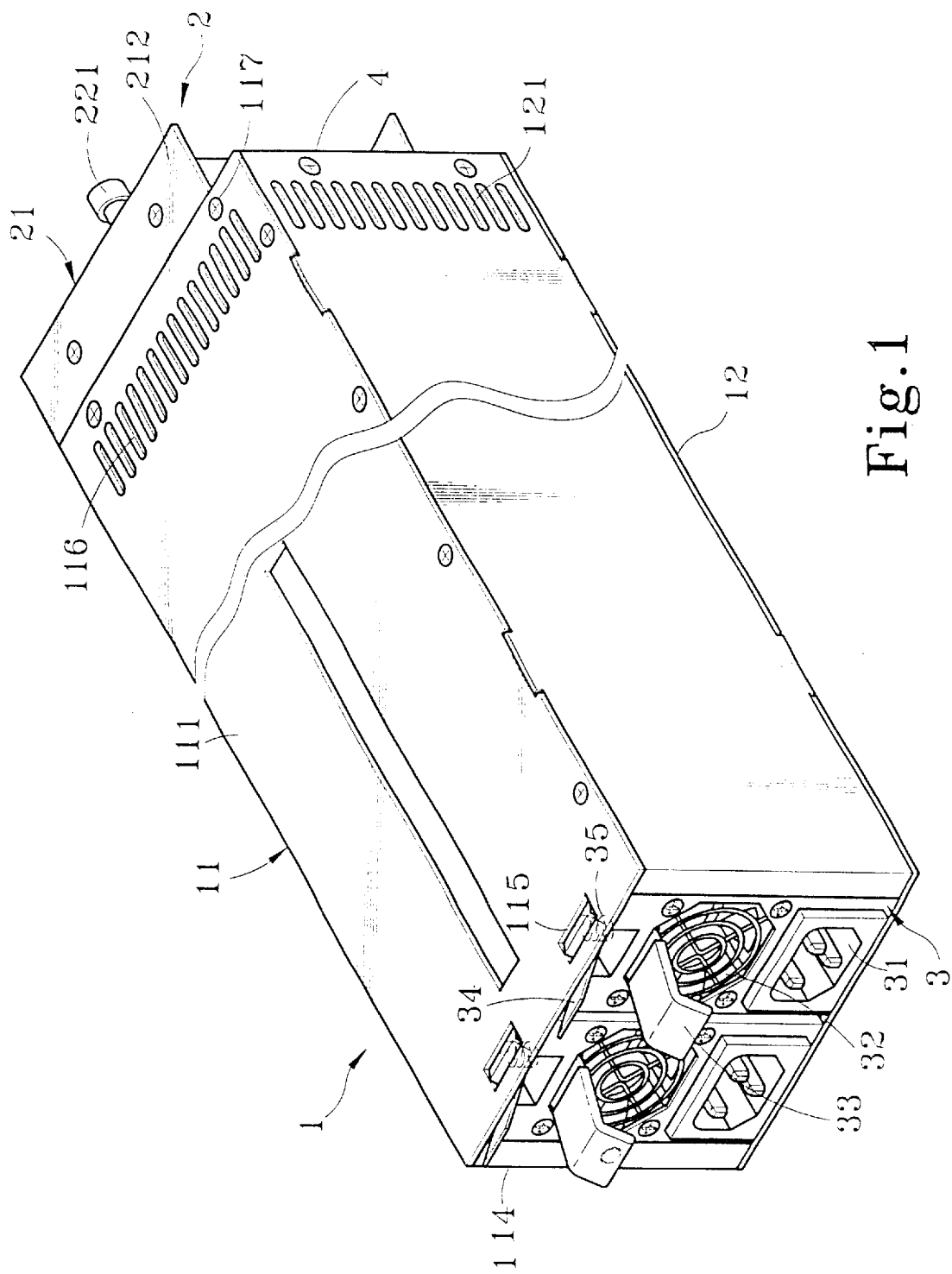
FIG. 1 is an elevational view of this invention in three dimensions.
Figure 2:
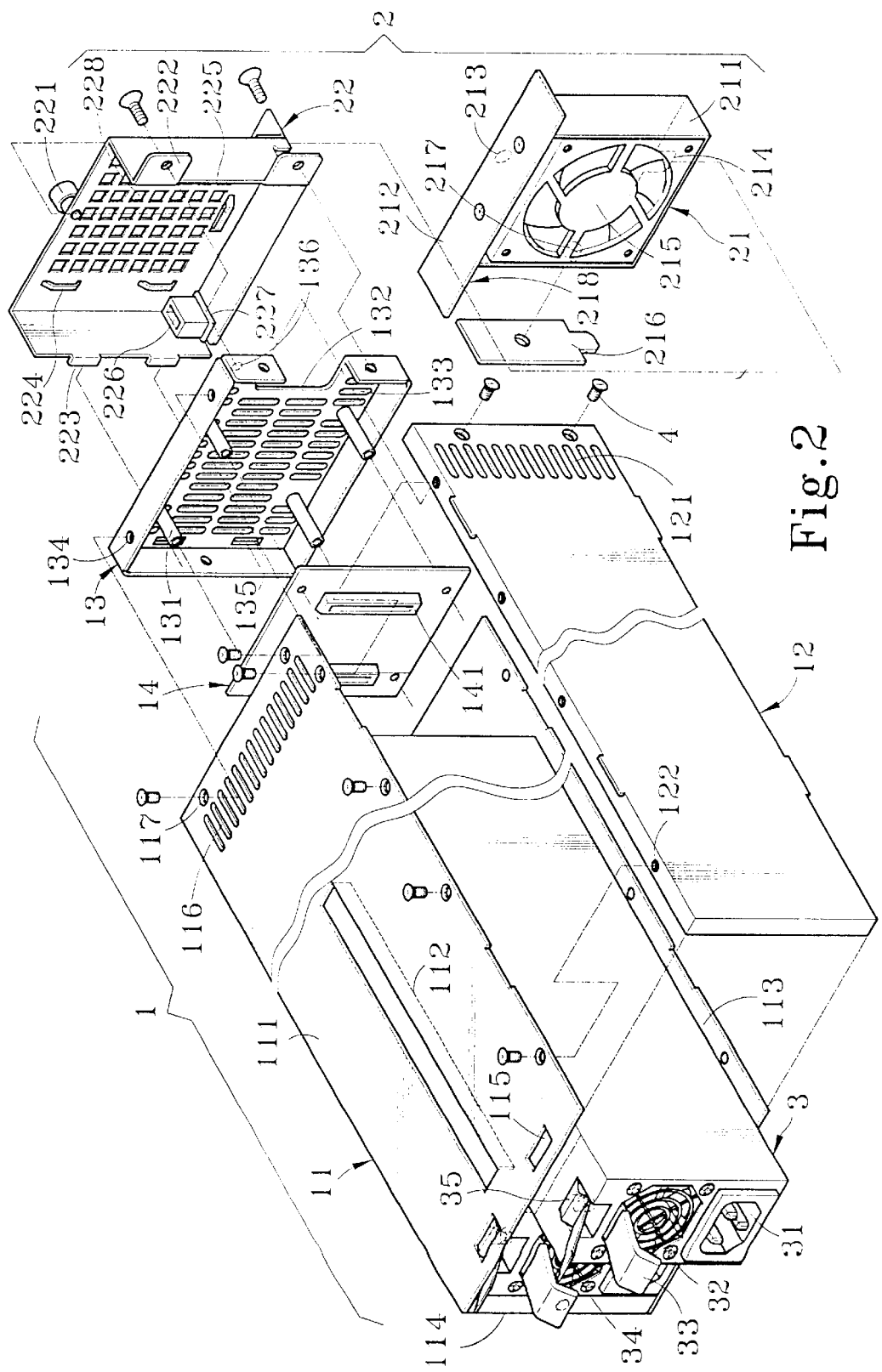
FIG. 2 is an exploded view of this invention in three dimensions.

As illustrated in FIGS. 1 and 2, a power supply endued with a redundant beck-up power is installed in a computer system, which may be a server, a disk-drive array, or an industrial or personal computer, comprising a casing 1 and an extractable fan set 2.

The casing 1 is essentially an empty store space enclosed by an open and a close end, comprising: a main frame 11 formed by a double bending to include a sole plate 113 having a tapped hole 117 at ends thereof apiece, a top cover 111, and a lateral wall 114; a lateral board 12 provided with a plurality of tapped holes 122 at a bent peripheral edge thereof for fixedly jointing to a lateral face of the main frame 11 with bolts 4; and a rear board 13 having a plurality of heat-dissipating holes 133 and a plurality of tapped holes 134 formed in a bent peripheral edge thereof for fixedly mounting to one end of the main frame 11 with bolts 4.

The sole plate 113 and the top cover 111 are punched to form a guiding track 112 respectively to divide the empty store space into two sections such that a power-supply unit(s) 3 can slide from the open end of the casing 1 along the guiding track 112 to enter the store space for being fixedly choked by taking advantage of a pressure piece 34 with a underlying spring 35 positioned correspondingly to a snap hole 115 in the top cover 111. Moreover, a plurality of positioning posts 131 fixedly disposed on the rear board 13 is jointed with a first circuit board 14 to enable the power-supply unit(s) 3 to couple with a slot 141 aligned on the first circuit board 14.

The extractable fan set 2 is assembled at the close end of the casing 1, wherein the extractable fan set 2 comprises a sub-frame 22 with a bent edge for jointing with the rear board 13 and defining an installation space in which a fan deck 21 is disposed. The fan deck 21 further comprises a shell 211 for mounting a first fan 215 and an upper cover 212 on the shell 211, wherein the upper cover 212 is extended to form a force-applying section 218. Moreover, the upper cover 212 may be integrally molded together with the shell 211.

The sub-frame 22 are extended to form a plurality of protruding ears 223 at a lateral end and fixing ears 222 at the other respectively at positions corresponding to a plurality of positioning slots 135 and fixing holes 136 of the rear board 13 so that the sub-frame 22 can be screw-jointed to the rear board 13 with bolts 4 that penetrate to lock the fixing ears 222 and the fixing holes 136 together after the protruding ears 223 have been inserted in the positioning slots 135 respectively.

In addition, the sub-frame 22 further includes a regulating portion 224 serving as a positioning aid to the fan deck 21, and on the bottom edge of the shell 211 and in the inner wall of the sub-frame 22, a snap ear 214 and a matchable reception portion 225 for holding the snap ear 214 are arranged respectively to allow the shell 211 of the fan deck 21 to be inserted in the installation space between the rear board 13 and the sub-frame 22 by leaning a lateral end of the shell 211 against and sliding along the regulating portion 224 to have the snap ear 214 choked in the reception portion 225. The entered shell 211 is then installed and fixed in the installation space by engaging a fixing member 221 with a jointing hole 213 perforated adjacently to the top edge of the shell 211 and of the sub-frame 22 respectively.

Moreover, in the same lateral portion of the shell 211 and the sub-frame 22, a second circuit board 216 is hung onto a protruding rod 217 of the shell 211 and connected with the first fan 215, and a third circuit board 227 in connection with the first circuit board 14 is provided with a slot 226 thereon and arranged in the sub-frame 22 so that the second circuit board 216 can be plugged in the slot 226 when the shell 211 is installed in the installation space.

Figure 3:
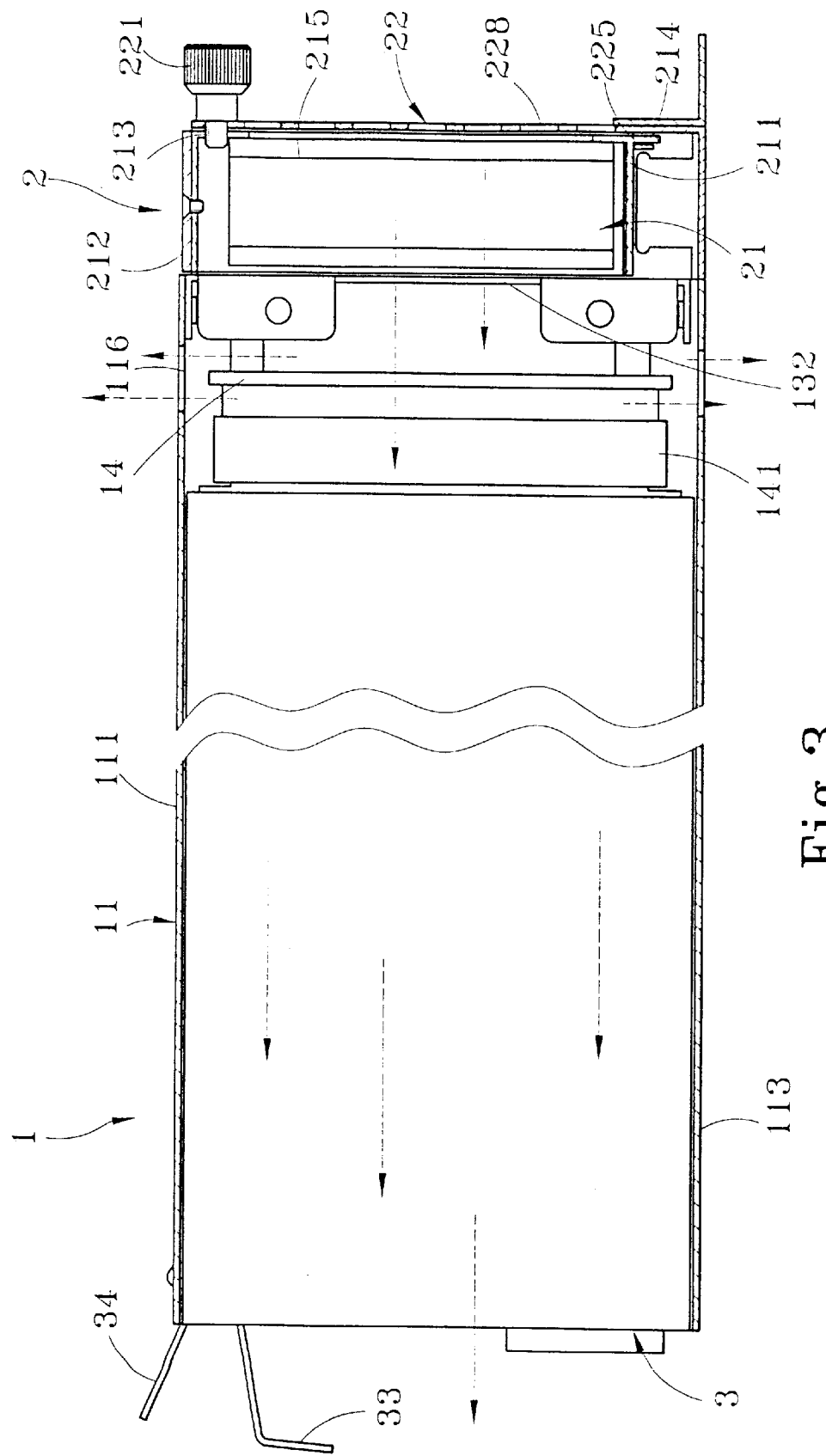
FIG. 3 is a cutaway sectional view of this invention.

Referring to FIGS. 2 and 3, after the power-supply unit(s) 3 aid the fan deck 21 have been installed in the store space and the installation space respectively, a power cord and a plurality of signal lines (not shown) coupled with the first circuit board 14 are extended to pass through a gap 132 in the rear board 13 and distributed to all the components inside the computer before introducing an external power source to an input port 31 of the power-supply unit(s) 3.

If the computer system is switched "ON", a second fan 32 at the front end of the power-supply unit(s) 3 and the first fan 215 on the fan deck 21 in connection with the first circuit board 14 via the second circuit board 216 and the third circuit board 227 are simultaneously started to rotate. Assuming the rotational direction of the first fan 215 is arranged to suck airflow through a plurality of heat-dissipating holes 228 in the sub-frame 22, the first fan 215 blows the airflow to. pass through the heat-dissipating holes 133 of the rear board 13 to cool down the first circuit board 14, then, minority of the airflow will escape from a plurality of heat-dissipating holes 116, 121 of the main frame 11 and the lateral board 12 respectively while majority of the airflow will go through the peripheral gap of the first circuit board 14 to enter and cool down the power-supply unit(s) 3, and the hot air is then sucked by the second fan 32 and rejected to outside of the computer. Above said arrangement of the first and the second fan 215, 32 is proven advantageous in cooling the power-supply unit(s) 3 and the first circuit board 14 and in improving the heat dissipation efficiency.

In the case of impairment of the fan deck 21 or the power-supply unit(s) 3, a user may hold the force-applying section 218 of the fan deck 21 or a bent grip 33 to depress the pressure piece 34 at the front end of the power-supply unit(s) 3 to draw either of them out.

Although, this invention has been described in terms of preferred embodiments, it is apparent that numerous variations and modifications may be made without departing from the true spirit and scope thereof, as set forth in the following claims.

What is claimed is:

1. A power supply equipped with extractable fan deck, the power supply being disposed in a computer, comprising:

a casing being essentially an empty store space enclosed by an open and a close end, further comprising: a main frame formed by a double bending; a lateral board provided with a plurality of tapped holes at a bent peripheral edge thereof for fixedly jointing to a lateral face of the main frame with bolts; and a rear board having a plurality of heat-dissipating holes and a plurality of tapped holes formed in a bent peripheral edge thereof for fixedly mounting to one end of the main frame with bolts; and moreover, a set of power-supply units and a first circuit board jointedly disposed on the rear board for coupling with the set of power-supply units being fitted in the casing; and an extractable fan set further comprising: a sub-frame with a bent edge for jointing and defining an installation space with the rear board and a fan deck disposed in the installation space;

wherein the extractable fan set is inserted in the close end of the casing to pair with a second fan of the power-supply units for creating air convection to cool down inside components of the power supply and for raising heat dissipation efficiency to keep the power supply under normal conditions.

2. The power supply equipped with fan deck according to claim 1, wherein the fan deck firther comprises a shell, which is bent to form an enclosure to house a first fan and an upper cover, which is housed on the shell and extended to form a force-applying section.

3. The power supply equipped with fan deck according to claim 2, wherein the upper cover is integrally molded together with the shell.

4. The power supply equipped with fan deck according to claim 1, wherein a snap ear and a matchable reception portion for holding the snap ear are arranged on the bottom edge of the shell and in the inner wall of the sub-frame respectively.

5. The power supply equipped with fan deck according to claim 1, wherein a jointing hole is perforated adjacently to both the top edge of the shell and the sub-frame respectively for penetratingly anchoring a fixing member.

6. The power supply equipped with fan deck according to claim 1, wherein a second circuit board for coupling with a first fan and a third circuit board for coupling with the first circuit board are disposed at a same lateral portion of the shell and the sub-frame respectively, and a slot for inserting the second circuit board is located on the third circuit board.

7. The power supply equipped with fan deck according to claim 1, wherein a regulating portion serving as a positioning aid to the fan deck is formed on the sub-frame.

8. The power supply equipped with fan deck according to claim 1, wherein the sub-frame is extended to form a plurality of protruding ears at a lateral end and fixing ears at the other respectively at positions corresponding to that of a plurality of positioning slots and fixing holes of the rear board so that the sub-frame can be screw-jointed to the rear board by locking the fixing ears to the fixing holes with a plurality of bolts after the protruding ears have been inserted in the positioning slots respectively.

* * * * *